(12) United States Patent
Cai et al.

(10) Patent No.: US 8,470,678 B2
(45) Date of Patent: Jun. 25, 2013

(54) TENSILE STRESS ENHANCEMENT OF NITRIDE FILM FOR STRESSED CHANNEL FIELD EFFECT TRANSISTOR FABRICATION

(75) Inventors: Ming Cai, Hopewell Junction, NY (US);
Dechao Guo, Fishkill, NY (US);
Chun-chen Yeh, Clifton Park, NY (US);
Pranita Kulkarni, Slingerlands, NY (US)

(73) Assignee: International Business Machines Corporation, Armonk, NY (US)

( * ) Notice: Subject to any disclaimer, the term of this patent is extended or adjusted under 35 U.S.C. 154(b) by 258 days.

(21) Appl. No.: 13/034,045

(22) Filed: Feb. 24, 2011

(65) Prior Publication Data

US 2012/0220114 A1    Aug. 30, 2012

(51) Int. Cl.
*H01L 21/00* (2006.01)

(52) U.S. Cl.
USPC ............ 438/303; 438/308; 438/791; 438/795

(58) Field of Classification Search
USPC .......................... 438/301–305, 308, 795, 791
See application file for complete search history.

(56) References Cited

U.S. PATENT DOCUMENTS

| 7,566,655 | B2 | 7/2009 | Balseanu et al. |
| 7,611,939 | B2 | 11/2009 | Mehrotra et al. |
| 7,732,342 | B2 | 6/2010 | Balseanu et al. |
| 8,022,422 | B2 * | 9/2011 | Kim et al. .................. 257/89 |
| 8,268,682 | B2 * | 9/2012 | Futase et al. ................ 438/197 |
| 2002/0113291 | A1 | 8/2002 | Adkisson et al. |
| 2006/0269693 | A1 | 11/2006 | Balseanu et al. |
| 2007/0007548 | A1 | 1/2007 | Conti et al. |
| 2008/0020591 | A1 | 1/2008 | Balseanu et al. |
| 2009/0174067 | A1 | 7/2009 | Lin |

OTHER PUBLICATIONS

B.C. Bittel et al., "Reliability and Performance Limiting Defects in Low-k Dielectrics for use as Interlayer Dielectrics", Physic Symposium 2010 IEEE International, May 5-6, 2010 pp. 947-950.
Kinya Goto, et al., "Stress Engineering in Cu/Low-Interconnects by using UV-Cure of Cu diffusion Barrier Dielectrics", Interconnect Technology Conference, 2006 International Jun. 5-7, 2006, Burlingame, CA USA.
M. Belyansky, et al., "Methods of producing plasma enhanced chemical vapor deposition silicon nitride thin films with high compressive and tensile stress," J. Vac. Sci. Technol. A., vol. 26, No. 3, May/Jun. 2008.

* cited by examiner

*Primary Examiner* — Richard Booth
(74) *Attorney, Agent, or Firm* — Cantor Colburn LLP; Vazken Alexanian (57) ABSTRACT

A method for inducing a tensile stress in a channel of a field effect transistor (FET) includes forming a nitride film over the FET; forming a contact hole to the FET through the nitride film; and performing ultraviolet (UV) curing of the nitride film after forming the contact hole to the FET through the nitride film, wherein the UV cured nitride film induces the tensile stress in the channel of the FET.

20 Claims, 7 Drawing Sheets

TENSILE STRESS ENHANCEMENT OF NITRIDE FILM FOR STRESSED CHANNEL FIELD EFFECT TRANSISTOR FABRICATION

BACKGROUND

This disclosure relates generally to the field of semiconductor fabrication, and more specifically to ultraviolet (UV) curing of nitride film to enhance a tensile stress in the nitride film.

Manipulating stress is an effective way of improving the carrier mobility in a complementary metal oxide semiconductor (CMOS) field effect transistor (FET). When stress is applied to the channel of a FET, the mobility of carriers, and as a consequence, the transconductance and the on-current of the FET, are altered from their original values for an unstressed channel FET. This is because the applied stress and the resulting strain on the semiconductor structure within the channel affects the band gap structure (i.e., breaks the degeneracy of the band structure) and changes the effective mass of the carriers. The effect of the stress depends on the crystallographic orientation of the plane of the channel, the direction of the channel within the crystallographic orientation, and the direction of the applied stress.

The effect of uniaxial stress, i.e., a stress applied along one crystallographic orientation, on the performance of semiconductor devices, especially on the performance of a FET device built on a silicon substrate, has been extensively studied in the semiconductor industry. For a p-type FET (PFET) with a silicon channel, the mobility of carriers (which are holes in the case of a PFET) in the channel increases under uniaxial compressive stress along the direction of the channel, i.e., the direction of the movement of holes or the direction connecting the drain to the source. Conversely, for an n-type FET (NFET) device with a silicon channel, the mobility of carriers (which are electrons in the case of an NFET) increases under uniaxial tensile stress along the direction of the channel, i.e., the direction of the movement of electrons or the direction connecting the drain to the source.

The stress in an FET channel may be induced by a stressed nitride film that is formed over the FET device. A nitride film formed over a PFET device may have a compressive stress, and a nitride film formed over an NFET device may have a tensile stress. UV curing of a tensile stressed nitride film may enhance the tensile stress in the nitride film by reconfiguring silicon-hydrogen/nitrogen-hydrogen bonds present in the nitride film. UV curing of nitride is performed by exposing the nitride to UV radiation, which has a wavelength in a range from about 10 nanometers (nm) to about 400 nm. The enhanced stress in the nitride film induces a corresponding enhanced stress in a channel of the FET over which the UV cured nitride film is located, increasing the carrier mobility in the FET channel.

BRIEF SUMMARY

In one aspect, a method for inducing a tensile stress in a channel of a field effect transistor (FET) includes forming a nitride film over the FET; forming a contact hole to the FET through the nitride film; and performing ultraviolet (UV) curing of the nitride film after forming the contact hole to the FET through the nitride film, wherein the UV cured nitride film induces the tensile stress in the channel of the FET.

In another aspect, a method forming a field effect transistor (FET), the FET including a gate, source/drain regions, and a channel, includes forming the gate on a substrate; forming the source/drain regions in the substrate on either side of the gate, wherein the channel is located in the substrate underneath the gate and between the source/drain regions; forming a nitride film over the gate and the source/drain regions; forming contact holes to the gate and source/drain regions through the nitride film; and performing ultraviolet (UV) curing of the nitride film after forming the contact holes to the gate and source/drain regions through the nitride film, wherein the UV cured nitride film induces a tensile stress in the channel of the FET.

Additional features are realized through the techniques of the present exemplary embodiment. Other embodiments are described in detail herein and are considered a part of what is claimed. For a better understanding of the features of the exemplary embodiment, refer to the description and to the drawings.

BRIEF DESCRIPTION OF THE SEVERAL VIEWS OF THE DRAWINGS

Referring now to the drawings wherein like elements are numbered alike in the several FIGURES.

DETAILED DESCRIPTION

Embodiments of a method for tensile stress enhancement of nitride film by performing UV curing after contact hole etch, with corresponding enhancement of channel tensile stress in a FET on which the nitride film is deposited, are provided, with exemplary embodiments being discussed below in detail. Formation of a nitride film over an FET and UV curing of the nitride film to enhance the stress in the nitride film are typically performed in succession. Contact holes, which are necessary to form electrical connections to the FET source/drain and gate regions, are then typically formed in the UV cured nitride film. However, forming contact holes in a tensile stressed nitride film after UV curing may cause significant relaxation of the tensile stress in the nitride film, which may largely negate the enhanced tensile stress induced in the nitride film by UV curing. This tensile stress relaxation may be greater in magnitude for smaller FET sizes, and may also be greater in magnitude for larger contact holes, which may be necessary to provide lowered contact resistance. By forming contact holes in the nitride film, and then performing UV curing of the nitride film to enhance the tensile stress of the nitride film, the relaxation of the tensile stress in the nitride film that is caused by contact hole formation may be reduced. The final tensile stress induced by the UV cured nitride film in the FET channel over which the UV cured nitride film is located is also correspondingly increased. The FET may be an NFET, and the tensile stress in the UV cured nitride film and corresponding tensile stress induced the NFET channel result in enhancement of electron mobility in the NFET channel.

A stressed nitride film may be deposited over a FET with a tensile stress from about 1.1 gigapascals (GPa) to about 1.2 GPa without UV curing. However, a nitride film that is to be UV cured may be deposited over a FET with a lower initial tensile stress, about 0.7 GPa in some embodiments. UV curing of a nitride film having an initial tensile stress of about 0.7 GPa may result in a tensile stress of about 1.6 GPa to 1.7 GPa in the nitride film after UV curing is completed. The tensile stress in the nitride film induces a corresponding tensile stress in the FET channel that is dependent on the geometry of the particular FET. For an example FET having a particular FET geometry, the tensile stress induced by the nitride film after UV curing in the channel of the FET may be about 720 megapascals (MPa). However, contact hole etching in the UV cured nitride film causes relaxation of the tensile stress in the nitride film. For example, the above-mentioned FET having a 720 MPa tensile stress in the channel after UV curing of the nitride film may see the tensile stress in the channel drop to a final tensile stress of about 470 MPa after contact hole etching through the UV cured nitride film. However, performing UV curing of the nitride film after contact hole etching yields a higher nitride film tensile stress and corresponding channel tensile stress. For the same example FET having the particular geometry, the final tensile stress induced in the channel by a nitride film that is UV cured after contact hole etching may be about 520 MPa, showing an increase in channel tensile stress of about 10% over the example FET with the nitride film that is UV cured before contact hole etching.

Figure 1:
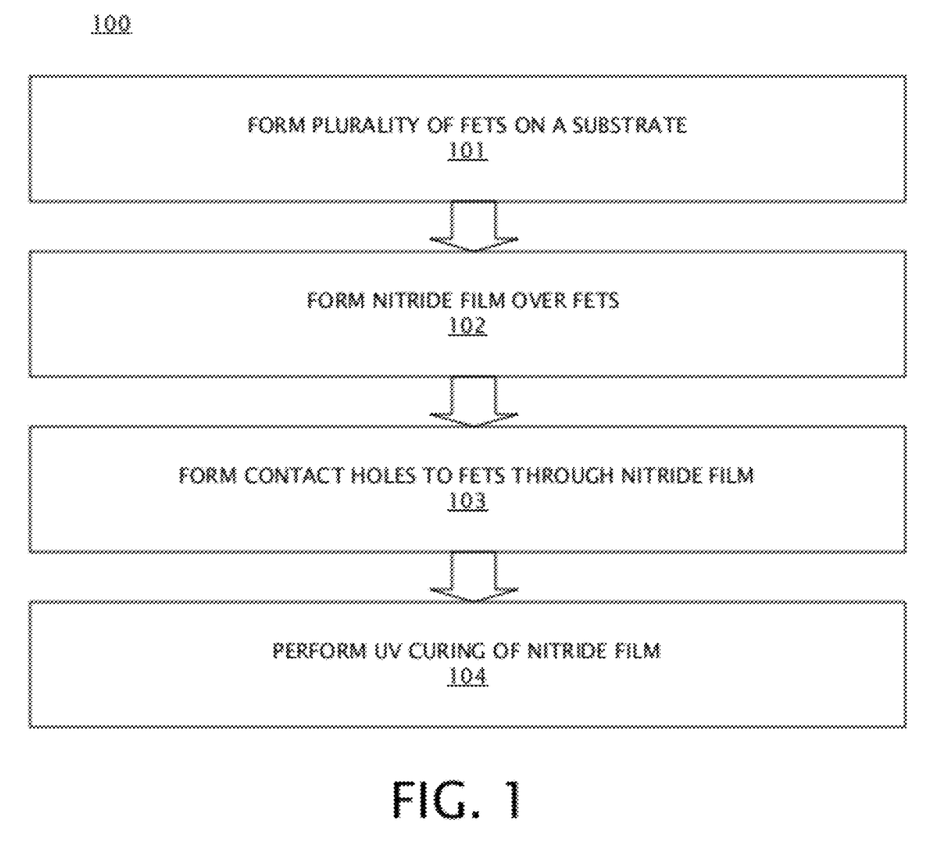
FIG. 1 is a flowchart illustrating an embodiment of a method for tensile stress enhancement of a nitride film for stressed channel FET fabrication by UV curing after contact hole etch.
Figure 2:
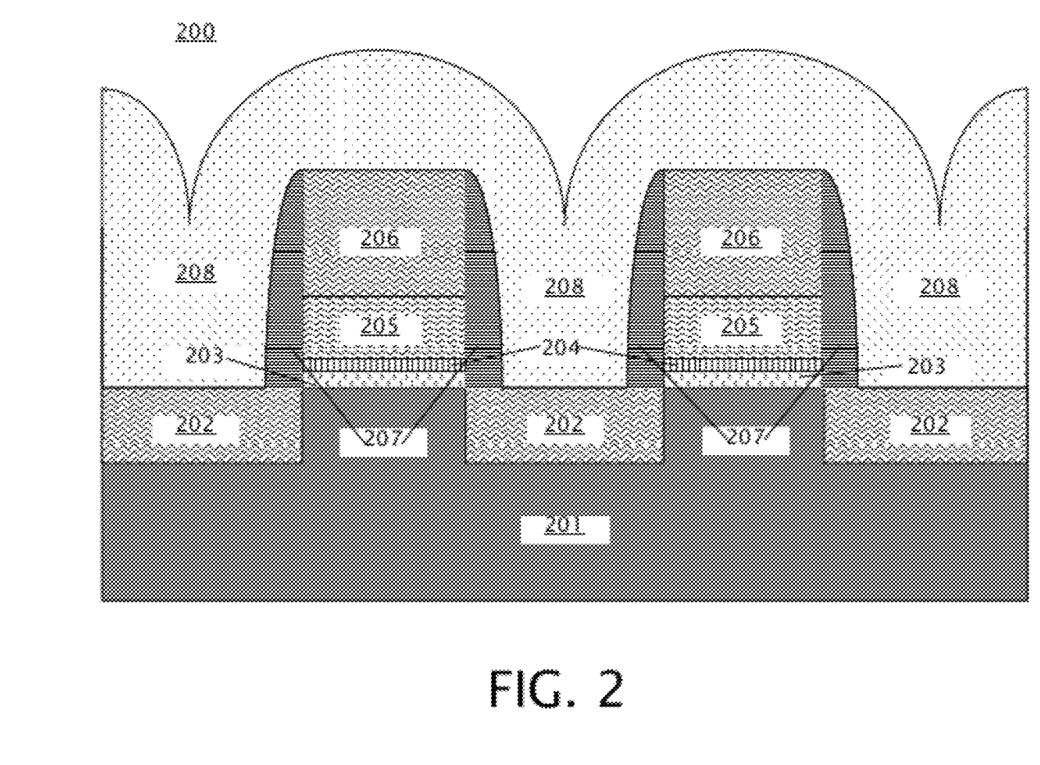
FIG. 2 is a schematic block diagram illustrating an embodiment of a nitride film formed over FET devices.

FIG. 1 illustrates an embodiment of a method 100 for tensile stress enhancement of a nitride film by UV curing after contact hole etch. FIG. 1 is discussed with respect to FIGS. 2-7. In block 101, a plurality of FET devices are formed on a substrate and then, in block 102, a nitride film 208 is formed over the plurality of FET devices that were formed in block 101. The plurality of FET devices are formed on a substrate 201, as shown in FIG. 2. The substrate 201 may include any appropriate substrate that may be used for CMOS device formation, such as silicon. The FET devices located on substrate 201 include source/drain silicide 202 on either side of a gate that includes gate dielectric 203 (which may be a high-k gate dielectric), gate metal 204, gate polysilicon 205, and gate silicide 206. The FET devices may be NFETs. Spacers 207 are located adjacent to the FET gates. Spacers 207 may include nitride or oxide in various embodiments. Nitride film 208 may be formed over the FET devices by deposition, which may include chemical vapor deposition (CVD) in some embodiments. Nitride film 208 may be formed with an initial tensile stress that may be about 0.7 GPa in some embodiments.

Figure 3:
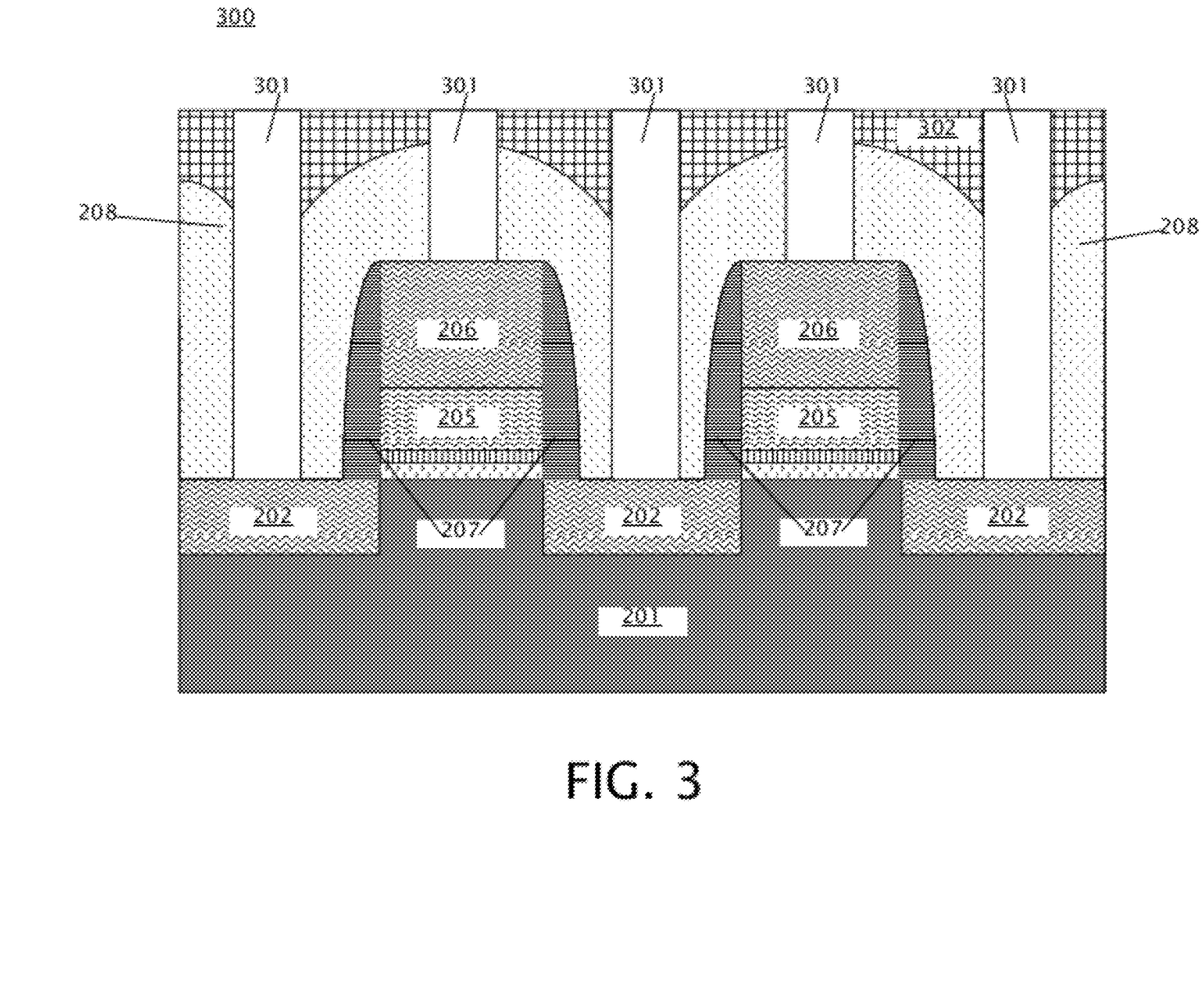
FIG. 3 illustrates an embodiment of the device of FIG. 2 after contact hole etching through the nitride film.
Figure 4:
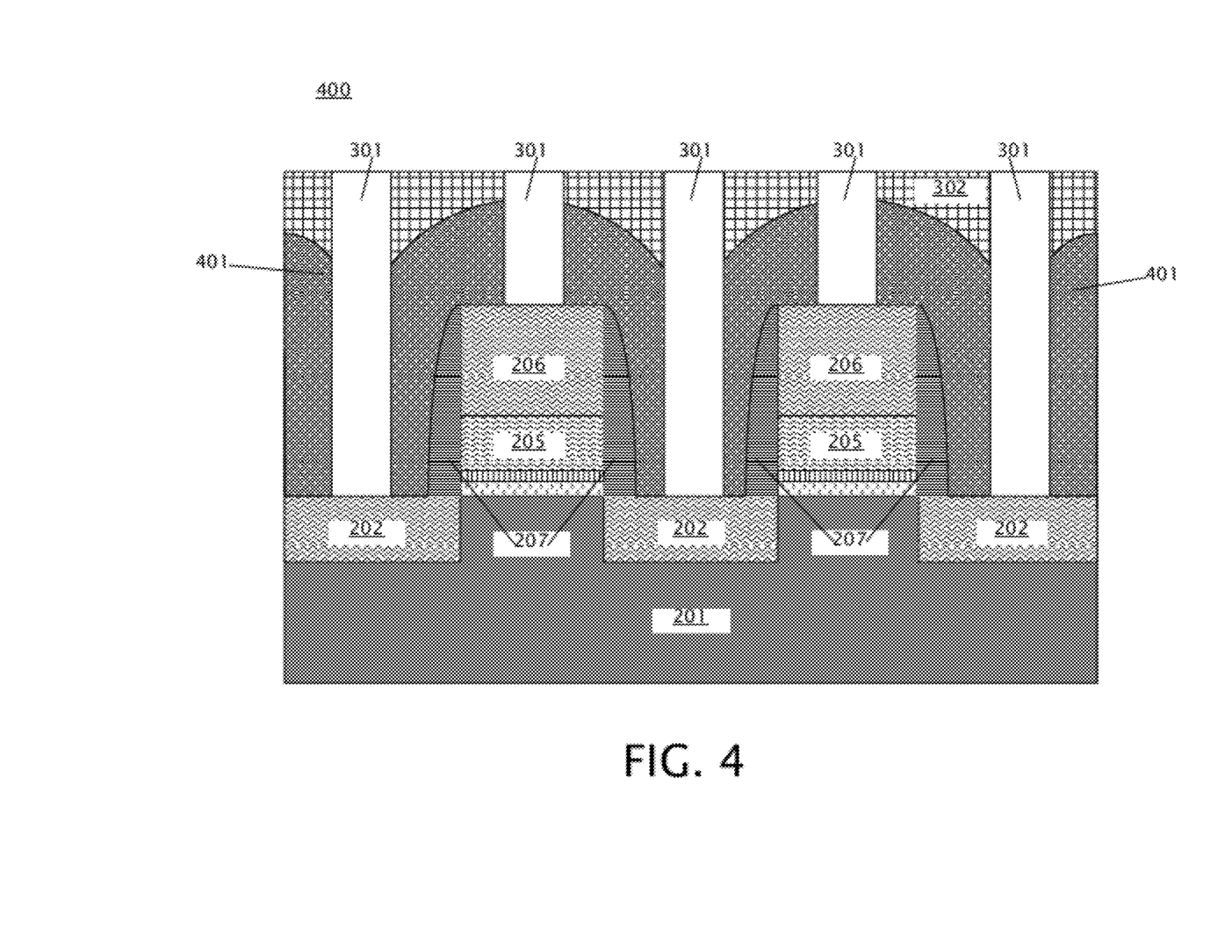
FIG. 4 illustrates an embodiment of the device of FIG. 3 after UV curing of the nitride film.
Figure 5:
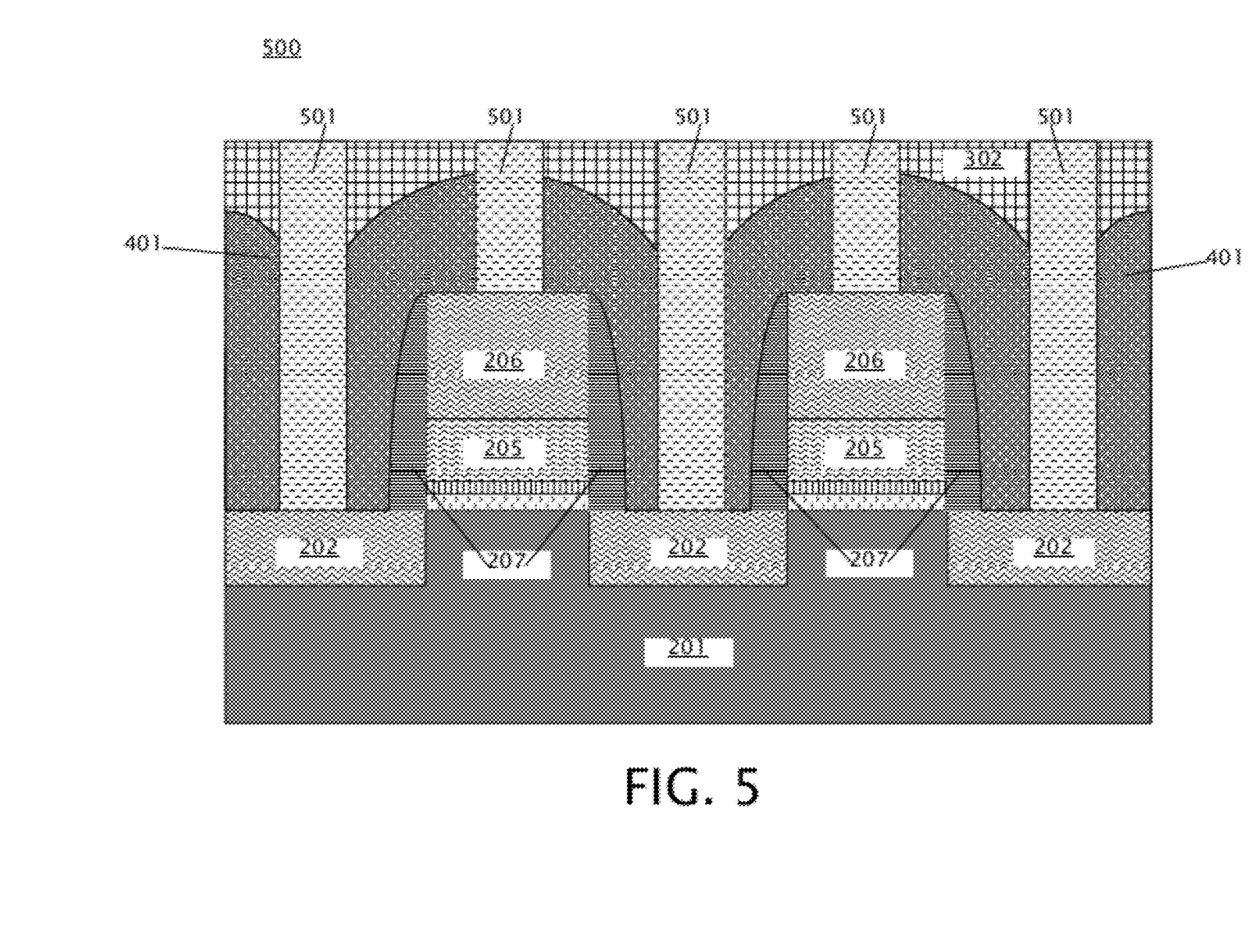
FIG. 5 illustrates an embodiment of the device of FIG. 4 after filling the etched contact holes with a contact metal.

In some embodiments, the contact holes may be formed in the nitride film 208 before the UV curing is performed, and then the contact holes may be filled with a contact metal after the UV curing is performed, as shown in FIGS. 3-5. Referring again to FIG. 1, in block 103, contact holes 301 are formed in nitride film 208, as shown in FIG. 3. First, oxide 302 may be formed over nitride film 208, and the top surface of oxide 302 may be polished flat. The contact holes 301, which allow electrical connections to the gate silicide 206 and the source/drain silicide 202, are then formed through the oxide 302 and the nitride film 208. Contact holes 301 may be formed by etching, which may include reactive ion etching (RIE) in some embodiments. Then, in block 104, nitride film 208 is UV cured (i.e., exposed to UV radiation) to form UV cured nitride film 401 as shown in FIG. 4. The UV cure of block 104 acts to increase the tensile stress in UV cured nitride film 401 as compared to nitride film 208. The tensile stress in UV cured nitride film 401 induces a tensile stress in the channels of the FET devices that are located underneath UV cured nitride film 401; the FET channels are located underneath the gate dielectric 203 and between source/drain silicide 202 in the substrate 201. The tensile stress induced in the FET channels increases the electron mobility in the FET channels. The final tensile stress induced in the FET channels by UV cured nitride 401 may be about 520 MPa in some embodiments. The UV cure of block 104 may be performed at a temperature of about 400° C. or greater in some embodiments. After UV curing to form UV cured nitride film 401 in block 104, contact holes 301 are filled with a contact metal 501 as shown in FIG. 5. Contact metal 501 provides the electrical connections to the FET gate silicide 206 and source/drain silicide 202. Contact metal 501 may be any appropriate electrically conductive metal.

Figure 6:
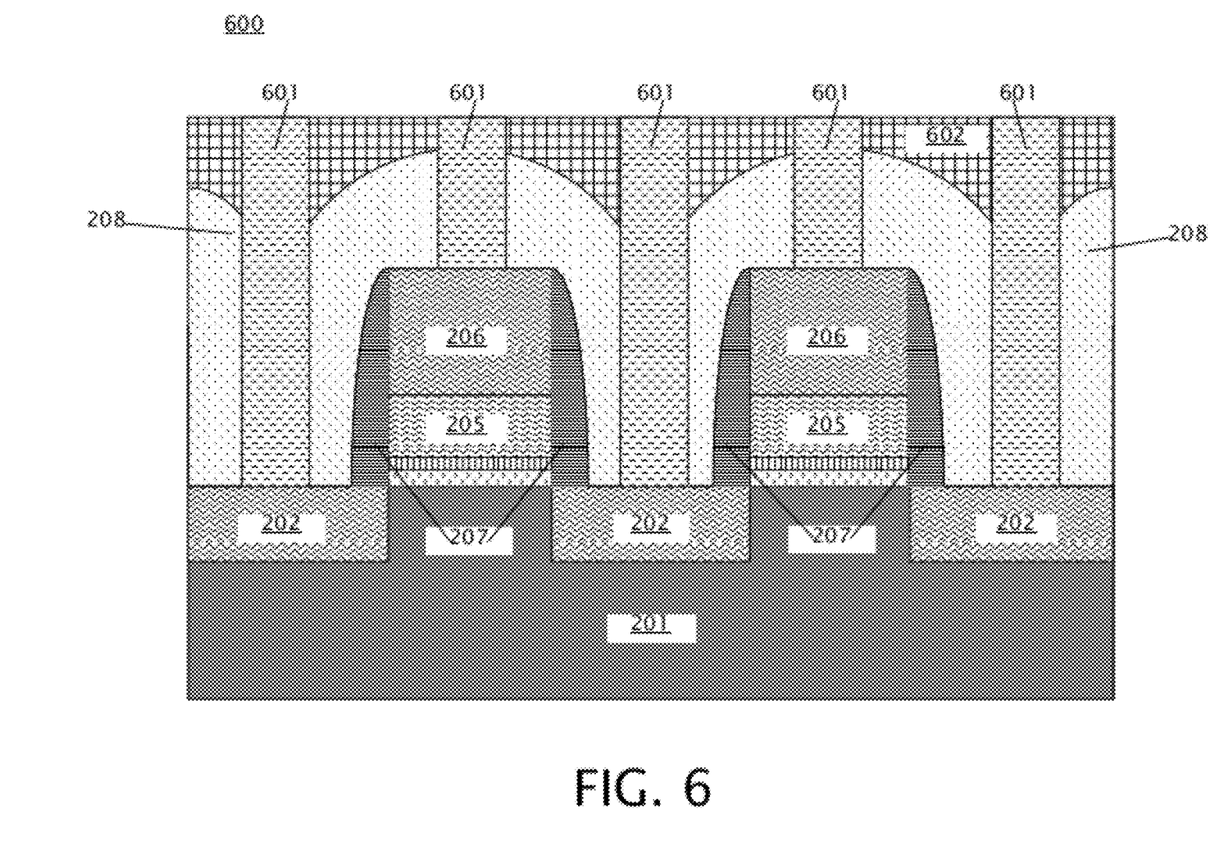
FIG. 6 illustrates an embodiment of the device of FIG. 2 after contact hole etching through the nitride film and filling the etched contact holes with a contact metal.
Figure 7:
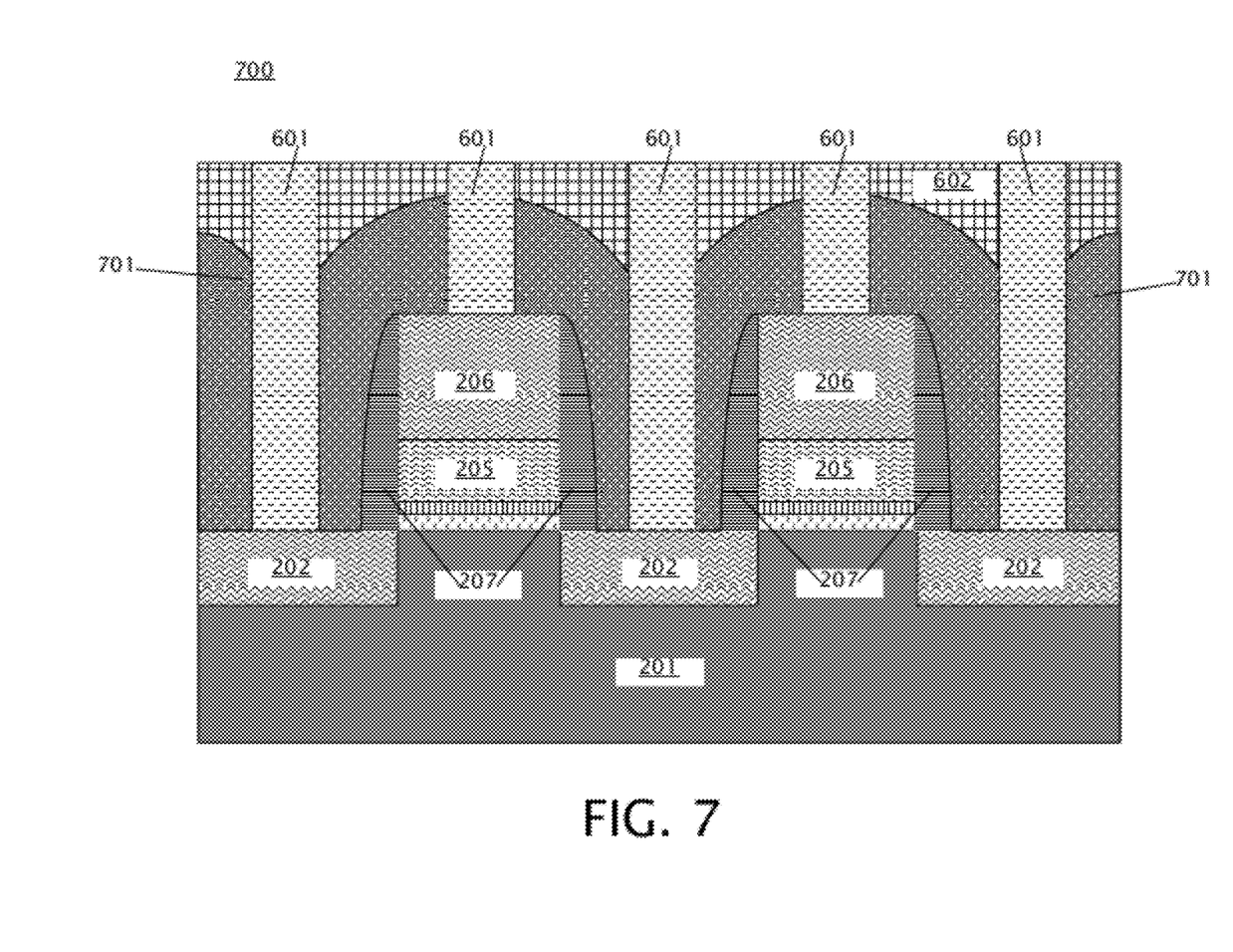
FIG. 7 illustrates an embodiment of the device of FIG. 6 after UV curing of the nitride film.

In other embodiments, the contact holes may be filled with contact metal before UV curing of nitride film 208 is performed, as shown in FIGS. 6-7. Referring again to FIG. 1, in block 103, contact holes are formed in nitride film 208, and the contact holes are filled with a contact metal 601, as shown in FIG. 6. First, oxide 602 may be formed over nitride film 208, and the top surface of oxide 602 may be polished flat. The contact holes, which allow electrical connections to the gate silicide 206 and the source/drain silicide 202, are then formed through the oxide 602 and the nitride film 208 and filled with the contact metal 601. The contact holes may be formed by etching, which may include RIE in some embodiments. Contact metal 601 provides the electrical connections to the FET gate silicide 206 and source/drain silicide 202. Contact metal 601 may be any appropriate electrically conductive metal. Then, in block 104, nitride film 208 is UV cured (i.e., exposed to UV radiation) to form UV cured nitride film 701 as shown in FIG. 7. The UV cure of block 104 acts to increase the tensile stress in UV cured nitride film 701 as compared to nitride film 208. The tensile stress in UV cured nitride film 701 induces a tensile stress in the channels of the FET devices that are located underneath UV cured nitride film 701; the FET channels are located underneath the gate dielectric 203 and between source/drain silicide 202 in the substrate 201. The increased stress in the FET channels increases the electron mobility in the FET channels. The final tensile stress induced in the FET channels by UV cured nitride 401 may be about 520 MPa in some embodiments. The UV cure of block 104 may be performed at a temperature of about 400° C. or greater in some embodiments.

The FET devices shown in FIG. 2-7 are shown for illustrative purposes only. Method 100 may be performed on any tensile stressed nitride film that is located over any appropriate number and type of FET devices, having, for example, any appropriate source/drain and gate composition, to increase the tensile stress induced in the FET channels by the UV cured nitride film. The FET devices may be located on any appropriate type of substrate, and any appropriate number and type of additional CMOS devices that are not covered by the nitride film may also be located on the substrate in various embodiments.

The technical effects and benefits of exemplary embodiments include enhanced tensile stress in an FET channel by reducing the relaxation of tensile stress in a UV cured nitride film that is caused by contact hole etching.

The terminology used herein is for the purpose of describing particular embodiments only and is not intended to be limiting of the invention. As used herein, the singular forms "a", "an", and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The invention claimed is:

1. A method for inducing a tensile stress in a channel of a field effect transistor (FET), the method comprising:
    forming a nitride film over the FET;
    forming a contact hole to the FET through the nitride film; and
    performing ultraviolet (UV) curing of the nitride film after forming the contact hole to the FET through the nitride film, wherein the UV cured nitride film induces the tensile stress in the channel of the FET.

2. The method of claim 1, wherein the nitride film is formed by deposition.

3. The method of claim 2, wherein the deposition comprises chemical vapor deposition (CVD).

4. The method of claim 1, wherein forming the contact hole to the FET through the nitride film comprises:
    forming an oxide layer over the nitride film;
    polishing a top surface of the oxide layer; and
    etching the contact hole through the oxide layer and the nitride film to the FET.

5. The method of claim 4, wherein etching the contact hole comprises reactive ion etching (RIE).

6. The method of claim 1, further comprising filling the contact hole with a contact metal before performing UV curing of the nitride film.

7. The method of claim 1, further comprising filling the contact hole with a contact metal after performing UV curing of the nitride film.

8. The method of claim 1, wherein UV curing of the nitride film comprises exposing the nitride film to UV radiation at a UV curing temperature.

9. The method of claim 8, wherein the UV curing temperature is about 400° C. or higher.

10. The method of claim 1, wherein the FET comprises an n-type FET (NFET), and wherein the tensile stress in the channel of the FET increases an electron mobility in the channel of the FET.

11. A method forming a field effect transistor (FET), the FET including a gate, source/drain regions, and a channel, the method comprising:
    forming the gate on a substrate;
    forming the source/drain regions in the substrate on either side of the gate, wherein the channel is located in the substrate underneath the gate and between the source/drain regions;
    forming a nitride film over the gate and the source/drain regions;
    forming contact holes to the gate and source/drain regions through the nitride film; and
    performing ultraviolet (UV) curing of the nitride film after forming the contact holes to the gate and source/drain regions through the nitride film, wherein the UV cured nitride film induces a tensile stress in the channel of the FET.

12. The method of claim 11, wherein the nitride film is formed by deposition.

13. The method of claim 12, wherein the deposition comprises chemical vapor deposition (CVD).

14. The method of claim 11, wherein forming the contact holes to the gate and source/drain regions through the nitride film comprises:
    forming an oxide layer over the nitride film;
    polishing a top surface of the oxide layer; and
    etching the contact hole through the oxide layer and the nitride film to the FET.

15. The method of claim 14, wherein etching the contact holes comprises reactive ion etching (RIE).

16. The method of claim 11, further comprising filling the contact holes with a contact metal before performing UV curing of the nitride film.

17. The method of claim 11, further comprising filling the contact holes with a contact metal after performing UV curing of the nitride film.

18. The method of claim 11, wherein UV curing of the nitride film comprises exposing the nitride film to UV radiation at a UV curing temperature.

19. The method of claim 18, wherein the UV curing temperature is about 400° C. or higher.

20. The method of claim 11, wherein the FET comprises an n-type FET (NFET), and wherein the tensile stress in the channel of the FET increases an electron mobility in the channel of the FET.

* * * * *